United States Patent
Van Veldhoven et al.

(10) Patent No.: US 7,113,119 B2
(45) Date of Patent: Sep. 26, 2006

(54) ELECTRONIC CIRCUIT WITH A SIGMA DELTA A/D CONVERTER

(75) Inventors: Robert Henrikus Margaretha Van Veldhoven, Eindhoven (NL); Lucien Johannes Breems, Eindhoven (NL); Eise Carel Dijkmans, Eindhoven (NL)

(73) Assignee: Koninklijke Philips Electronics, N.V., Eindhoven (NL)

( * ) Notice: Subject to any disclaimer, the term of this patent is extended or adjusted under 35 U.S.C. 154(b) by 48 days.

(21) Appl. No.: 10/502,728

(22) PCT Filed: Dec. 23, 2002

(86) PCT No.: PCT/IB02/05730

§ 371 (c)(1),
(2), (4) Date: Jul. 27, 2004

(87) PCT Pub. No.: WO03/065590

PCT Pub. Date: Aug. 7, 2003

(65) Prior Publication Data

US 2006/0017595 A1 Jan. 26, 2006

(30) Foreign Application Priority Data

Jan. 30, 2002 (EP) .................................. 02075389

(51) Int. Cl.
*H03M 3/00* (2006.01)

(52) U.S. Cl. .................. 341/143; 341/155; 341/159
(58) Field of Classification Search ................ 341/143
See application file for complete search history.

(56) References Cited

U.S. PATENT DOCUMENTS

| 5,274,375 | A * | 12/1993 | Thompson ................. 341/143 |
| 6,040,793 | A * | 3/2000 | Ferguson et al. ........... 341/143 |
| 6,304,608 | B1 * | 10/2001 | Chen et al. ................. 375/252 |
| 6,346,898 | B1 * | 2/2002 | Melanson ................... 341/143 |
| 6,369,730 | B1 * | 4/2002 | Blanken et al. ............ 341/143 |
| 6,404,367 | B1 * | 6/2002 | Van der Zwan et al. .... 341/143 |
| 6,584,157 | B1 * | 6/2003 | Van Der Zwan et al. ... 375/247 |
| 6,653,958 | B1 * | 11/2003 | Morche ...................... 341/118 |

* cited by examiner

*Primary Examiner*—Rexford Barnie
*Assistant Examiner*—Khai M. Nguyen (57) ABSTRACT

The A/D convener has a digital output for outputting a digital output signal selected from a set of three or more available values. A feedback loop generates the digital output signal so that a time averaged difference between an analog input signal and an analog feedback signal representative of the digital output signal is minimized. A feedback signal generator generates successive signal levels of the feedback signal. A return to zero switch inserts predetermined return to zero levels between the signal levels in the feedback signal. The return to zero switch is also used to provide the signal level for one of the available values.

4 Claims, 4 Drawing Sheets

ELECTRONIC CIRCUIT WITH A SIGMA DELTA A/D CONVERTER

The invention is based on and claims priority from international applications 371 of PCT/IB02/05730, filed Dec. 23, 2002 and FPO 02075389.3, filed Jan. 30, 2002.

The invention relates to an electronic circuit with a sigma delta analog to digital converter.

An analog to digital converter converts an analog input signal, which may assume any one of a continuum of values, into a series of successive digital output signals, each of which represents one of an integer number of possible signal values. A sigma delta analog to digital converter makes use of a feedback loop that minimizes a difference between the input signal and a feedback signal that comprises output levels represented by the digital output signal, averaged over time.

Sigma delta digital to analog converters usually use one bit output signals, which represent one of two output levels, but converters with more possible output levels are also known. PCT patent application WO 01/01578 for example describes a sigma delta analog to digital converter with 3 or 5 possible output values, that correspond to different analog signal levels. The use of more than two possible output values has the advantage that a greater signal to noise ratio is possible with a given number of output signals per second.

However, when the output can correspond to more than two possible output levels, the risk occurs that spread in the distances between the output levels introduces non-linearity errors in the analog to digital conversion. WO 01/01578 eliminates these errors by adding corrections to the output signals. During a calibration phase this sigma delta converter reduces the number of possible output levels to three in order to measure the corrections that are needed to improve linearity. The circuitry used to generate the feedback signal in this signal delta converter is not described in detail, but presumably a selection circuit may be used that selectively connects an output for the feedback signal to one of three voltage sources, dependent on which of the three values is assumed by the output signal.

PCT patent application WO 00/65723 describes a sigma delta analog to digital converter with a return to zero switch. The return to zero switch is provided to improve the linearity of the circuit. The linearity may be compromised by memory effects that depend on the combination of output signal values that are output successively. The return to zero switch eliminates these memory effect by ensuring that the feedback signal is reset to a standard value each time between assuming values corresponding to successive output signal values.

The circuit of WO 00/65723 uses a differential current outputs to generate the feedback signal. Switches in series with respective ones of these differential current outputs implement the return to zero switch.

Amongst others it is an object of the invention to provide a circuit with a sigma delta analog to digital converter that allows more than two possible output signal values with little overhead.

Amongst others it is an object of the invention to provide a circuit with a sigma delta analog to digital converter that allows more than two possible output signal values and that does not need calibration.

The invention provides for an electronic circuit provided with a sigma delta analog to digital converter, comprising an analog input for receiving an analog input signal;

a digital output for outputting a digital output signal comprising a sequence of output signal values, each from a set of three or more available values;

a feedback loop arranged to generate the digital output signal so that a time averaged difference between the analog input signal and an analog feedback signal representative of the digital output signal is minimized;

a feedback signal generator for generating successive signal levels of the feedback signal, each under control of a respective one of the output signal values, the feedback signal generator comprising a return to zero switch circuit for inserting predetermined return to zero levels between the signal levels in the feedback signal, the return to zero switch circuit being coupled to provide the signal level for one of the available values.

By using the return to zero switch circuit not only to separate output values, but also to provide one of the output values a simple circuit is obtained that combines the elimination of non-linearities due to memory effects with the higher signal to noise ratio of sigma delta analog to digital conversion with more than two possible output levels. In this context, the return to zero switch circuit may consist of a single switching element, or of a plurality of switching elements. The return to zero switch circuit connects for example an output to a node that supplies a return to zero level or it connects differential outputs to each other or to a common node or to different nodes that supply at least substantially the same return to zero level signal.

The circuit according to the invention has an embodiment that uses differential current outputs for generating the feedback signal, in combination with a return to zero switch circuit that forces the sum of the differential currents to zero when active. In this way an even spacing between the different possible output levels can be ensured without complex calibration.

In a further embodiment the differential currents are generated using a pair of resistors connected to respective ones of the summing nodes and a switching circuit that controls the voltage applied across the resistors dependent on the digital output signals. The return to zero level is generated by electrically connecting the summing nodes via the resistors. In this way, the return to zero switch effaces all memory of internal previous states.

In a further embodiment the switching circuit commutes a voltage applied across the internal nodes. Thus, only a single voltage is needed to create two of the signal levels of the feedback signal, the return to zero switch creating a third level by connecting the internal nodes. As a result no calibration is needed to ensure linearity of analog to digital conversion. For the applied voltage a stabilized reference voltage such as a bandgap reference may be used. Thus, the scale of the analog to digital converter can easily be made independent of external influences.

These and other objects and other advantageous aspects of the invention will be described in more detail using the following figures.

Figure 1:
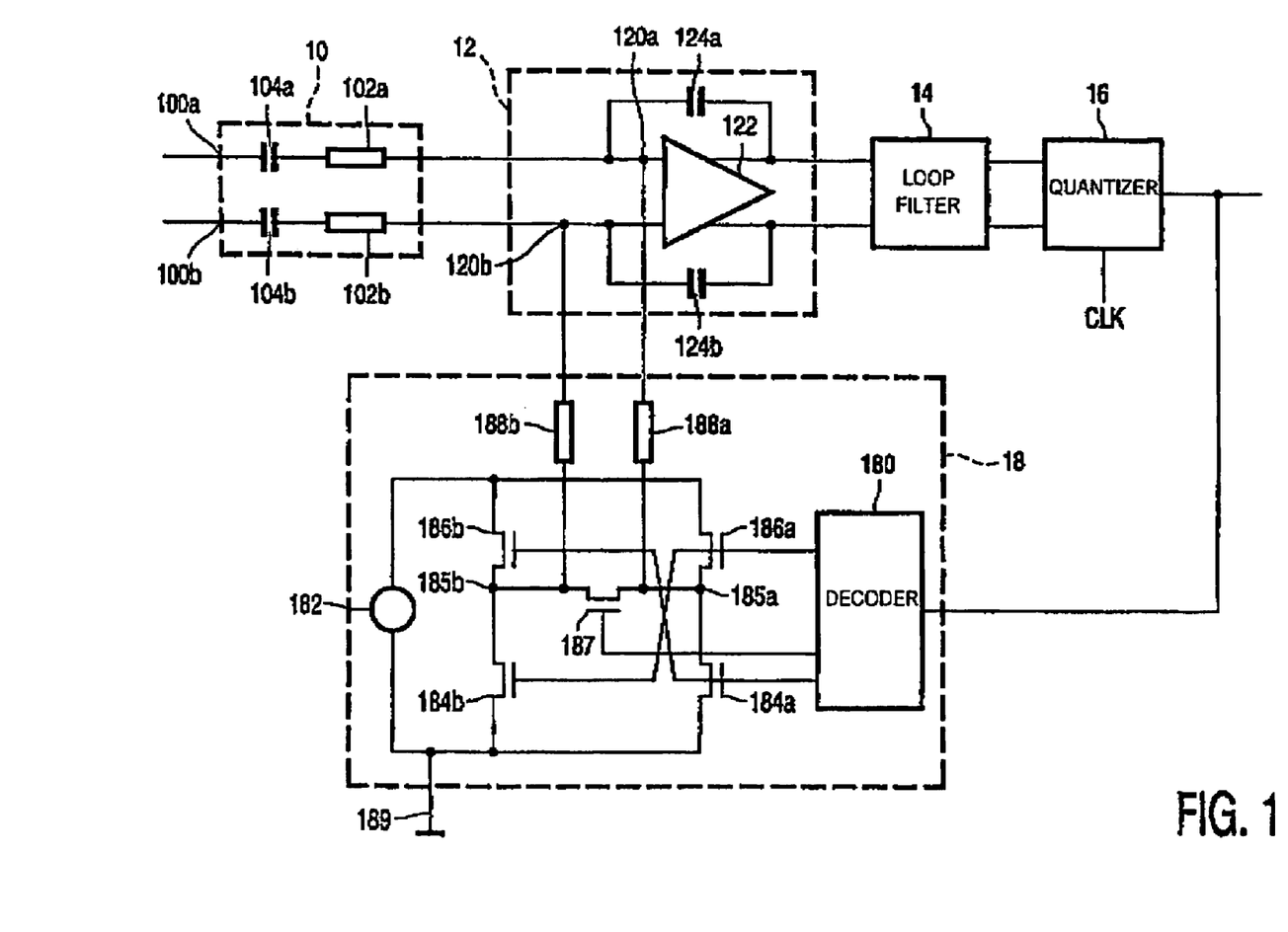
FIG. 1 shows a sigma delta analog to digital converter

FIG. 1 shows a sigma delta digital to analog converter. The converter contains an input stage 10, a subtraction stage 12, a loop filter 14, a quantizer 16, and a feedback signal generator 18. The input stage 10 has differential input terminals 100*a,b* and outputs coupled to summing nodes 120$a,b$ of subtraction stage 12. By way of example, input stage 10 is shown to contain a capacitor 104$a,b$ and a resistor 102$a,b$ in series between each input 100$a,b$ and a corresponding summing node 120$a,b$.

The subtraction stage 12, the loop filter 14 and the quantizer form a digitizing stage for forming a digital output signal from the difference signal, obtained from an average difference between the input signal and the output signal. The subtraction stage 12 contains a differential amplifier 122, with inputs coupled to the summing nodes 120$a,b$ and with feedback capacitors 124$a$, 124$b$ coupled between the outputs of the amplifier 122 and its inputs. The outputs of the subtraction stage 12 are coupled to the quantizer 16 via loop filter 14. Quantizer 16 has a clock input and an output of the quantizer 16 forms an output of the sigma delta converter. The output of the quantizer 16 is coupled back to an input of the feedback signal generator 18. The feedback signal generator 18 has differential outputs coupled to the summing nodes 120$a,b$ of subtraction stage 12. The loop filter 14 is for example a fourth order filter, but the precise type of filter is not essential for the invention.

In operation, a differential input signal is applied across the inputs 100$a,b$ and a digital output signal is produced at the output of the quantizer 16. Signals corresponding to the differential input signal and the output signal are subtracted from one another by subtraction stage 12. The resulting difference is filtered by loop filter 14 and quantized to determine the output signal. The loop filter 14 averages the difference over time. As a result the sigma delta converter produces an output signal that, averaged over time, tracks the differential input signal.

Such a analog to digital converter may be used for example in a wireless signal receiving circuit that receives signal modulated on a carrier.

Figure 3:
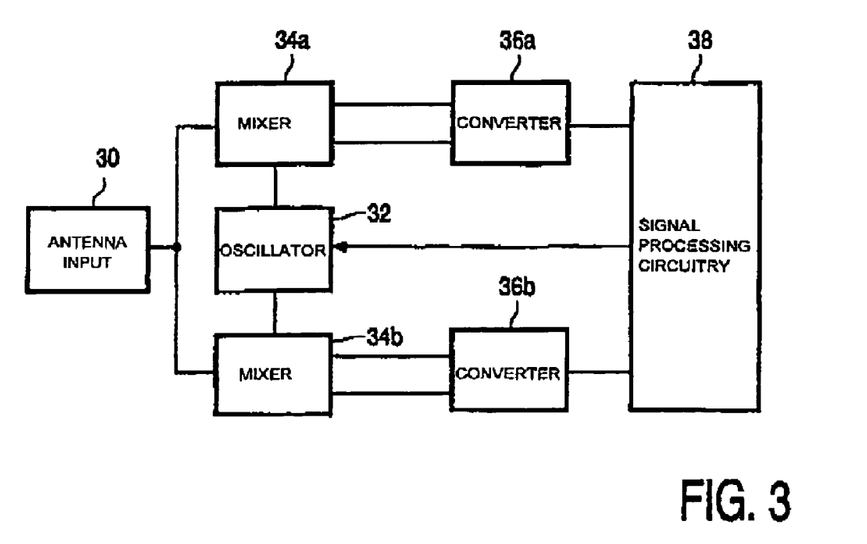
FIG. 3 shows a receiving circuit

FIG. 3 shows a receiver using a sigma delta analog to digital convener as shown in FIG. 1. The receiver contains an antenna input 30, a local oscillator 32, mixers 34$a,b$ analog to digital converters 36$a,b$ and signal processing circuitry 38. In operation the mixers 34$a,b$ down convert an antenna signal to quadrature signals in a predetermined frequency band (for example a low frequency band). The analog to digital converters 26$a,b$ sample and digitize the quadrature signals. Preferably the converters 36$a,b$ are both of the type shown in FIG. 1, because this type provides the linearity and dynamic range needed to distinguish signals in the presence of strong irrelevant signals.

In a receiver, the intended signal is often accompanied by other modulated signals, some of which may be as strong as or stronger than the intended signal. To extract the intended signal nevertheless, one needs a wide dynamic range (ratio between the maximum possible input value and the resolution of analog to digital conversion). The dynamic range can be improved by using more than two possible output values, but normally this requires considerable circuit overhead and it incurs the risk of non-linearities which hamper unperturbed reception of weak signals in the presence of strong signals.

Figure 2:
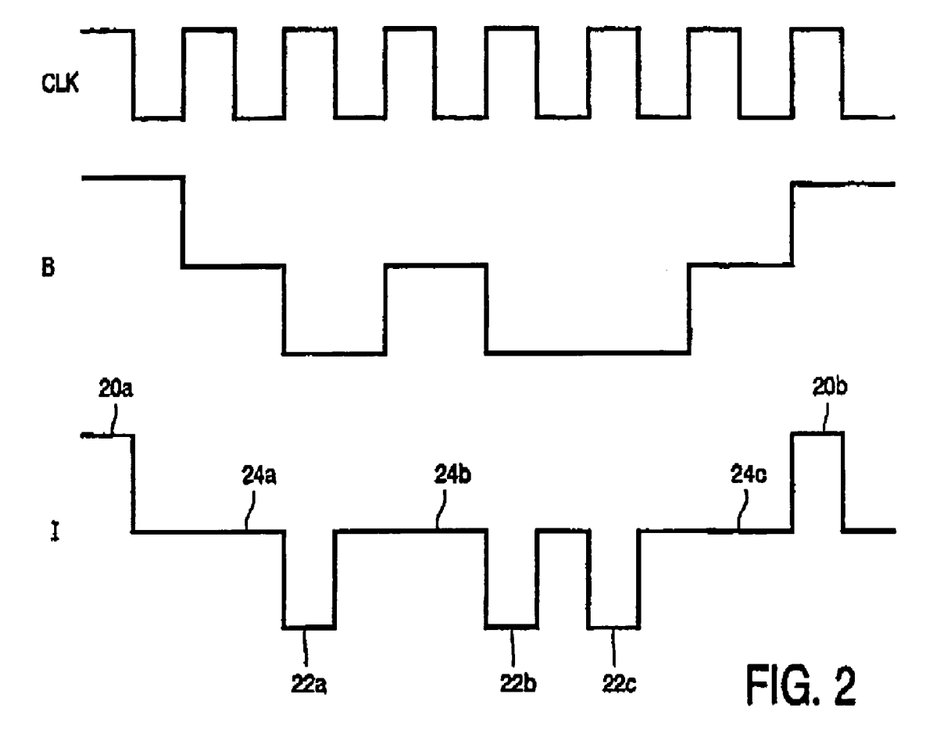
FIG. 2 shows signals occurring in a converter

FIG. 2 shows a clock signal C and a signal B representative of the output signal of the quantizer 16. Quantizer 16 is designed to produce an output signal value for each clock pulse, the output signal taking one of three values. The signal B is limited to the three possible levels representing those values (of course the actual output signal of the quantizer is a digital signal that may represent the levels in any form, for example using a pair of bits for each output signal). The quantizer 16 may be realized for example by using two comparators (not shown) in quantizer 16, the quantizer producing a first value when the difference between the signals at its inputs is below the threshold level of both comparators, a second value when the difference is below one of the threshold levels but above the other and a third value when the difference is above both threshold levels.

Feedback signal generator 18 supplies a feedback signal I corresponding to the signal B to the subtraction circuit. In each clock period a first phase and a second phase occurs. In the first phase the feedback signal I is determined by the signal B in that clock period. In the second phase the feedback signal is independent of the signal B. The second phase serves as a return to zero phase between the first phases of different clock cycles, to eliminate interactive effects between the signals supplied in the first phases of the different clock periods. The feedback signal I supplied in the first phase may take three different values: the same value 24$a$–$d$ as in the second phase or values 20$a$–$b$, 22$a$–$c$ on opposite sides of that value 24$a$–$d$.

When the feedback signal I in the first phase assumes the same value 24$a$–$c$ as in the second phase this is realized by the same means that are used to realize the signal in the second phase. Thus, a feedback signal I with three possible levels is realized with little or no additional hardware.

Returning to FIG. 1 in more detail, feedback signal generator 18 contains a decoder 180, a bandgap reference 182, a first pair of transistors 184$a,b$, a second pair of transistors 186$a,b$ a return to zero transistor 187 and a pair of resistors 188$a,b$ with substantially equal resistance value. The output of the quantizer 16 is coupled to an input of the decoder 180. The decoder 180 has a first output coupled to the control electrodes of the first pair of transistors 184$a,b$, a second output coupled to the control electrodes of the second pair of transistors 186$a,b$ and a third output coupled to the control electrode of the return to zero transistor 187.

The summing nodes 120$a,b$ are coupled to respective internal nodes 185$a,b$ each via a respective one of the resistors 188$a,b$. The internal nodes 185$a,b$ are coupled to each other via the main current channel of the return to zero transistor 187. A first one of the internal nodes 185$a$ is coupled to a reference terminal 189 via a parallel arrangement of a first and second path. The first path contains the main current channel of a first one 184$a$ of the first transistor pair. The second path contains the main current channel of a first one 186$a$ of the transistors of the second pair 186$a$ and the bandgap reference 182 in series. Similarly a second one of the internal nodes 185$b$ is coupled to the reference terminal 189 via a parallel arrangement of a third and fourth path. The third path contains the main current channel of a second one 184$b$ of the first transistor pair and the bandgap reference 182 in series. The fourth path contains the main current channel of a first one 186$a$ of the transistors of the second pair 186$a$.

In operation, subtraction is realized by summing currents from the input 100$a,b$ and the feedback signal generator 18 at the summing nodes 120$a,b$. FIG. 2 shows the feedback signal I in the form of a differential current I that is the difference between the currents flowing from the feedback signal generator 18 to the summing nodes 120$a,b$, via the resistors 188$a,b$.

Decoder 180 controls feedback signal generator 18 to supply currents to summing nodes 120$a,b$ in one of three different current configurations, providing a positive differential current, a negative differential current and zero differential current respectively, under control of the signal B. During each clock period a first phase occurs in which current is supplied in a configuration determined by the signal B in that clock period, and in a second phase in which current is supplied in a configuration in which no current is supplied, independent of the signal B. The second phase serves as a return to zero phase that eliminates interactive effects between the currents supplied in the first phase of different clock periods.

In a first configuration a positive differential current 20a,b occurs when mutually opposite currents run to the summing nodes 120a,b via resistors 188a,b the current to a first one of the summing nodes 120a having a first sign and the current to the second one of the summing nodes 120b having a second sign opposite to the first sign. In the second configuration a negative differential current 22a–c occur when mutually opposite currents run to the summing nodes, but in opposite directions compared with the first configuration: the current to the first one of the summing nodes 120a has the second sign and the current to the second one of the sunning nodes 120b has the first sign. In the third configuration zero differential current 24a–d occurs.

Mutually opposite currents through resistors 188a,b are ensured as follows. Assuming that the input signal is differential, the common mode voltage of the summing nodes 120a,b is half the bandpap voltage above the voltage at the reference terminal 189. This is because decoder 180 controls the transistor pairs 184a,b 186a,b so that either one or none of the pairs conducts current at a time. Hence, when any of the pairs 184a,b, 186b conducts one internal node 185a,b is coupled to the reference terminal the other node is coupled to the bandgap reference 182. As a result the sum of the voltages on the summing nodes 120a,b equal to the bandgap reference voltage.

The differential amplifier 122 functions as a differential op-amp and is arranged in a negative feedback arrangement by capacitors 124a,b. As a result the amplifier 122 equalizes the voltages at the summing nodes 120a,b, so that both are equal to the common mode voltage. Consequently, the differential input voltage leads to mutually opposite currents to the summing nodes 120a,b. Similarly, feedback signal generator supplies differential currents to the summing nodes 120a,b, under control of the output signal from quantizer 16.

Decoder 180 controls which one of the pairs 184a,b, 186a,b conducts, dependent on the output signal of the quantizer 16 (represented by the signal B). When one of the transistor pairs 184a,b, 186a,b conducts and the return to zero transistor 187 does not conduct one internal node 185a,b is at the voltage of the reference terminal 189 and the other internal node 185a,b is a bandgap reference voltage above the voltage of the reference terminal. In this case, since the voltage at the summing nodes is half the bandgap voltage above the voltage of the reference terminal, the currents though resistors 188a,b are mutually opposite.

It will be appreciated that the invention is not limited to the circuit of FIG. 1. For example, another form of generating three current levels from feedback signal generator may be used.

Figure 4:
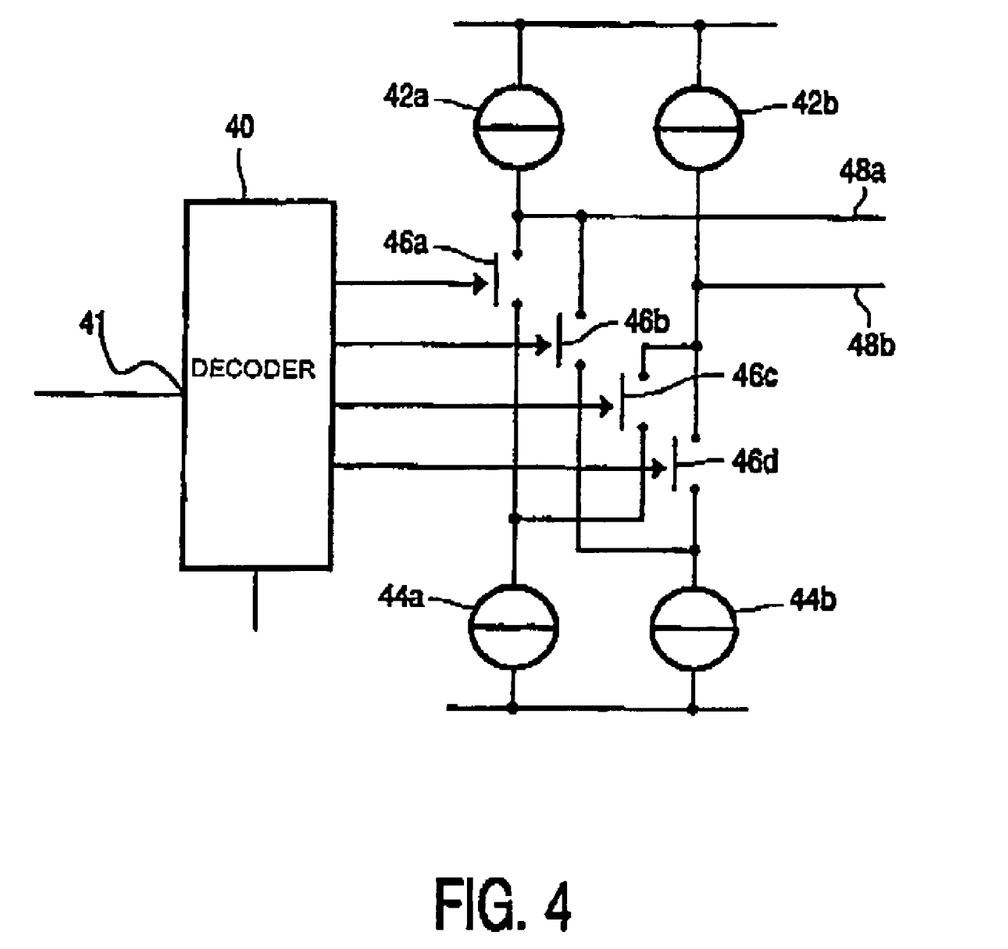
FIG. 4 shows a feedback signal generating circuit

FIG. 4 shows a digital to analog converter that contains a decoder 40, a first and second current source 42a,b a third and fourth current source 44a,b and a number of switches 46a–d. A first and a second output 48a,b of the digital to analog converter together form a differential output of the circuit. The first output 48a is coupled to an output of the first current source 42a and the second output 48b of the digital to analog converter is coupled to an output of the second current source 42b. The first output 48a is coupled to outputs of the third and fourth current source 44a,b via respective ones of the switches 46a,b respectively. The second output 48a is coupled to outputs of the third and fourth current source 44a,b via further respective ones of the switches 46c, d respectively. The first, second, third and fourth current source 42a,b 44a,b are arranged to supply substantially identical output currents. The switches are controlled by decoder 40, under control of a clock input clk and a digital signal received at a digital input 41.

Figure 5:
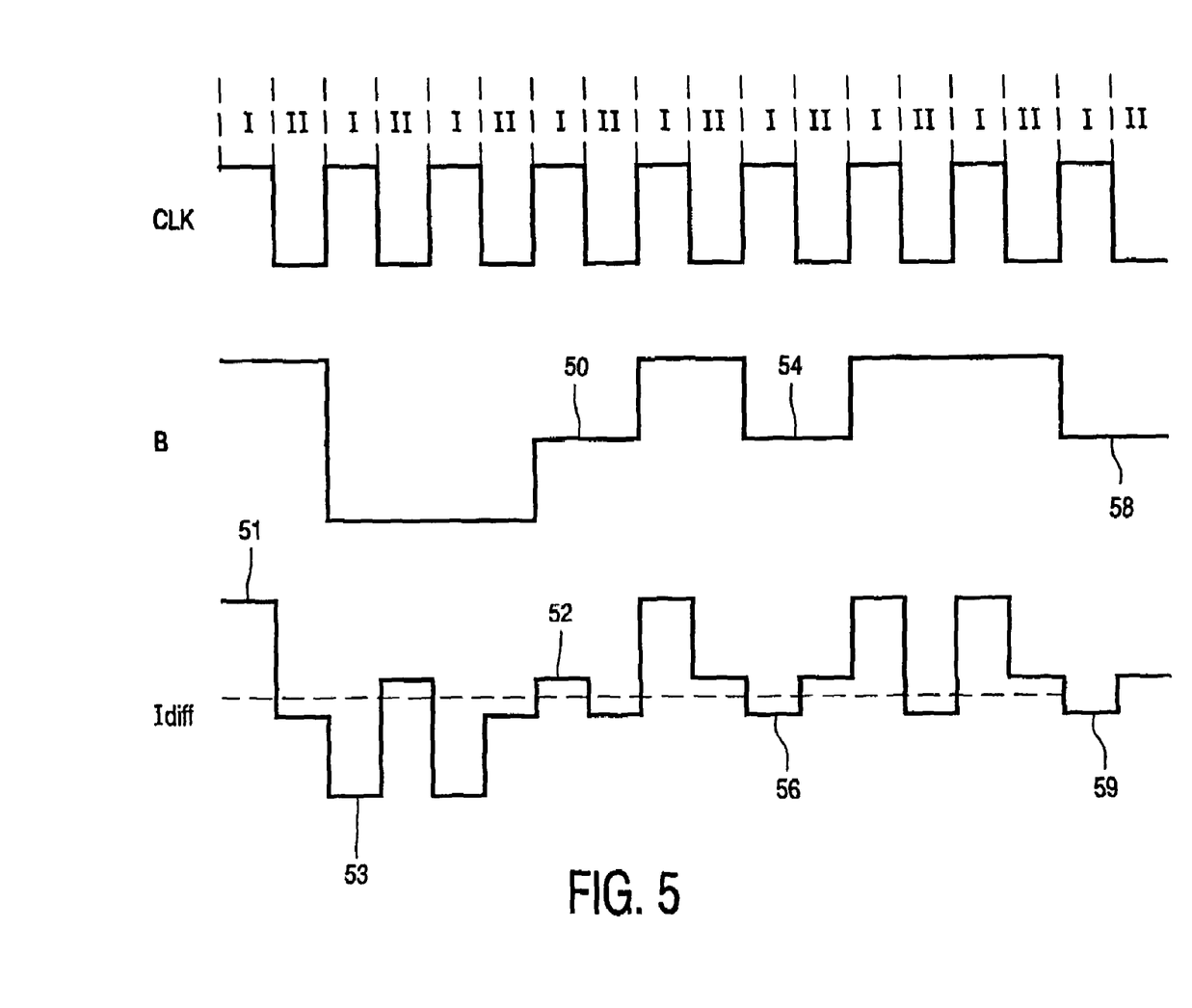
FIG. 5 shows a feedback signal

FIG. 5 shows signals illustrating the operation of the circuit of FIG. 4. A first signal clk illustrates the clock signal, alternate first and second phases of the clock cycles are indicated by I and II. A second signal B illustrates an example of a digital input signal. The digital signal contains a series of code values that represent signal values. By way of illustration the digital input signal B is shown to assume three levels that correspond to different code values.

A third signal Idiff illustrates a difference between net currents flowing to the outputs 48a,b. The circuit operates in two alternating phases I, II. In first phases I the decoder 40 controls the switches 46a–d dependent on the data in order to supply a data dependent net current difference to the outputs 48a,b. In second phases II the decoder 40 controls the switches 46a–d to supply a return to zero current difference to the outputs 48a,b.

When the digital input signal B codes for a high level decoder 40 controls the switches 46a–d in the first phase so as to connect the output of both the third and fourth current source 44a,b to the output of the second current source 42b. Thus, the net current at the first output is equal to a current Ia from the first current source 42a. Assuming the currents from the first, second third and fourth current source 42a,b to be identical, the net current at the second output 48b is −Ia. The difference between the net currents at the first and second output is 2 Ia, which corresponds to a high level differential output current 51.

Similarly, when the digital input signal B codes for a low level decoder 40 controls the switches 46a–d in the first phase so as to connect the output of both the third and fourth current source 44a,b to the output of the first current source 42b. Thus, the difference between the net currents at the first and second output becomes −2 Ia, which corresponds to a low level differential output current 53.

When the digital input signal B codes for a third level decoder 40 controls the switches 46a–d in the first phase so as to connect the output of the third and fourth current source 44a,b to the output of the first and second current source 42b respectively, or to the second and first current source 42b respectively. Thus, the difference between the net currents at the first and second output becomes zero.

The circuit is made to output the third input signal in the same way as the return to zero level. In the second phase decoder 40 also makes the difference zero by controlling the switches 46a,b to connect the output of the third and fourth current source 44a,b to the output of the first and second current source 42b respectively, or to the second and first current source 42b respectively.

In practice, current sources 42a,b, 44a,b may not supply identical currents due, for example, to geometrical or parameter differences in the implementation of the different current sources. The result of non-identical currents is that the difference in net currents from the outputs 48a,b at the return to zero level is not exactly midway the difference output for the high and the low level. This is not a problem when the return to zero level is used only as a return to zero level and not as third output level that may be selected by the digital input signal B. But it will result in non-linearity of digital to analog conversion when the return to zero level is used as a third output level that may be selected by the digital input signal B.

In order to counter this non linearity the third level is preferably chopped, by using two different states to supply current for the third level so that on average the output current for the third level is exactly midway between the high and low level. In the first state the decoder 40 controls switches 46a–d to connect the output of first current source 42a to the output of the third current source 44a and to connect the output of second current source 42b to the output of the fourth current source 44b. Crosswise, in the second state the decoder 40 controls switches 46a–d to connect the output of first current source 42a to the output of the fourth current source 44b and to connect the output of second current source 42b to the output of the third current source 44a.

The following table summarizes the net currents flowing to the outputs 48a,b in the first and second state, in terms of I1, I2, I3, I4, the currents from the first, second, third and fourth current source 42a,b 44a,b respectively. Additionally, the currents with high and low digital input B are included in the table.

|  | output 48a | output 48b | difference |
| --- | --- | --- | --- |
| B high | I1 | I2 – I3 – I4 | I1 – I2 + I3 + I4 |
| B low | I1 – I3 – I4 | I2 | I1 – I2 – I3 – I4 |
| State 1 | I1 – I3 | I2 – I4 | I1 – I2 – I3 + I4 |
| State 2 | I1 – I4 | I2 – I3 | I1 – I2 + I3 – I4 |

It will be remembered that I1–I4 are all substantially equal, except for inaccuracies. It will be noted that the current difference deviates with opposite polarity from I1–I2 and for high and low input signals B. In the first and the second state there are small deviations from the level I1–I2 midway between the levels for the high and low input signal B. The average of the levels for the first and second state is exactly at this level I1–I2 midway between the levels for the high and low input signal B. This will be used to counteract the non-linearities even if the currents are not equal to each other.

Decoder 40 is preferably arranged to make use of both state 1 and state 2 to produce the output current when the digital input signal assumes the third level between the high and the low level and/or in the second phases. In different clock cycles decoder 40 selects different states, so that on average the output current for the third level is midway between the high and low level, i.e. the two states are selected just as frequently. Thus, loop filter 14 will average out the non-linearity that occurs when the third level is used.

Various methods may be used to select the states used to control the output current in the first phases I when the input signal assumes the third value. Each method should preferably ensure that both states occur just as frequently, at least on average. Of course the current in each individual state still deviates from the ideal value, but because the current is equal to the ideal value on average most of the deviation is filtered out by the loop filter 14. Preferably, as much of the spectral density of the deviations should be moved to frequencies that are filtered out by the loop filter 14. Therefore, the method of selection of the states should preferably promote that the spectral density of the deviations is moved to higher frequencies (frequencies that are filtered out by the loop filter 14).

In a first set of embodiments the states used in the first phases I are selected independent of the states used in the second phases II. However, this limits the maximum frequency to which the spectral density of the deviations can be used. Therefore in a second set of embodiments selection of the states used in the first and second phases is dependent on one another. This makes it possible to move the spectral density to higher frequencies.

In the embodiments in which the states used in the first phases I are selected independent of the states used in the second phases II any state may be used to provide the return to zero current in the second phases II between the first phases I in which input signal controlled currents are supplied. For example, the same state may always be used in the second phase. This leads to a DC offset signal, but such an offset signal is irrelevant in most applications such as audio output or wireless signal reception. Alternatively, the state used in the second phase may be alternated in successive clock cycles. In yet another alternative, the state used in the second phase may be toggled from one clock cycle to another. Of course, when no return to zero levels are needed the circuit may simply provide input signal controlled output currents during the entire clock period. In this case no second phase is needed, or the second phase may last only temporarily, in transients during switching.

When the states used in the first phases are selected independent of the states used in the second phases various methods may be used to select the states in the first phases I. In a first embodiment, decoder 40 simply uses state 1 and state 2 alternately when the third level occurs. Thus it is easily ensured that the average current difference for the third level is midway between the current differences for the high and low level. This can be implemented for example by including a toggle flip-flop (not shown) in decoder 40, the toggle flip-flop controlling the state used to control the switches 46a–d when the input signal B selects the third level, the toggle flip-flop toggling each time when the input signal B selects the third level. In this way the spectral density of the deviations is moved to higher frequencies, but the maximum frequency is limited by the frequency with which the third level occurs. When the maximum frequency is low, the spectral density is small, since the third level occurs with low frequency, but in some applications this frequency is too low to average out the deviations.

In an embodiment decoder 40 uses state 1 in even clock cycles and state 2 in odd clock cycles. This also ensures that the average current difference for the third level is midway between the current differences for the high and low level. This can be implemented for example by including a toggle flip-flop (not shown) in decoder 40, the toggle flip-flop controlling the state used to control the switches 46a–d when the input signal B selects the third level, the toggle flip-flop toggling each clock cycle. In yet another embodiment an pseudo random generator, such as a properly designed LFSR (Linear Feedback Shift Register) may be used to toggle the toggle flip-flop. In all of these embodiments the maximum frequency to which the spectral density of the deviations is moved is limited by the frequency with which the third level occurs. In some applications this frequency is too low to average out the deviations.

In another embodiment, the previous input signal is used to select the state in the first phase I. That is, when a third level input signal occurs in a clock cycle and the input signal in the previous clock cycle was high, the first state is selected in the clock cycle. When the input signal in the previous clock cycle was low the second state is selected. When the previous input signal has the third value the state is toggled relative to the state of the preceding clock cycle. Since both high and low levels occur equally frequently this ensures that on average both states occur equally frequently. This method of selecting the states can be implemented for example using a latch (not shown) in decoder 40, the latch latching the previous input signal when that input signal was high or low and the latch latching the logic opposite of its previous content when the input signal assumed the middle value. However, this method has the drawback that the states are correlated with the input signal in such a way that part of the spectral density of the deviations occurs at low frequencies.

The spectral density of the deviations can be moved to higher frequencies when selection of the states used in the first phases and the second phases is made interdependent. FIG. 5 shows the result of an alternative embodiment for selecting the state used in the first phase. In this embodiment decoder 40 alternates the selected state each time when the middle value is output, both when it is output in a first phase and when it is output in a second phase. This alternative embodiment can be implemented in various ways. For example by including a toggle flip-flop (not shown) in decoder 40, the toggle flip-flop controlling the state used to control the switches 46*a–d* when the third level is output both in the first phase and the second phase, the toggle flip-flop toggling each time such a third level is output. An alternative implementation is for example the use of toggling signal that toggles between successive phases independent of the data B, and a flip-flop that is toggled each clock cycle the digital input signal B does not assume the middle value. In this alternative embodiment a signal that selects the state to be used is formed by forming an exclusive OR of the toggling signal and the output of the flip-flop.

Thus, as long as a high or low value is output in the first phase of a clock cycle, the state used to output the RTZ level in the second phase is simply toggled between the first and second state. When a third value is output in a clock cycle, different states will be used in the first and second phase, the state in the first phase being selected dependent on the state used in the last previous clock cycle.

In FIG. 5, for example, the states used in successive second phases are alternated unless a third level signal occurs in the intervening first phase (the different states are recognizable from slightly higher and lower levels 52, 56). In a first clock cycle a middle value input signal 50 occurs. In this first clock cycle the first state (shown as having a slightly higher level 52 than the level midway between the high and the low level) is used to generate the output signal in the first phase. In a next clock cycle in which a middle value of the input signal 54 occurs, the second state is used (shown as having a slightly higher level 56 than the level midway between the high and the low level), because an odd number of clock cycles has occurred since the previous cycle in which the input signal assumed middle value 50. In the next clock cycle in which input signal assumes the middle value 58 the second state 59 is used again because this time an even number of clock cycles gas occurred since the previous middle value 54.

In this way the signals output for successively selected ones of the states effectively form the output signal of a digital oscillator with a nominal oscillation period corresponding to half the sample frequency. The oscillation of this oscillator is phase modulated dependent on the digital input signal B when that digital input signal assumes the third value between the high and low values. In this way the spectral density of the deviations of the signal used in the first phases is modulated onto the spectral density of deviations in the second phases. Thereby the spectral density is placed at high frequencies, so that it can be more easily filtered out. This is achieved at the expense of the spectral density of deviations due to selection of the state used for the RTZ level in the second phases. Compared with the embodiment in which the state used for the RTZ level in the second phases is alternated independent of the data part of the spectral density due selection of different states in the second phases is moved to lower frequency. However, this spectral density still remains at frequencies that can easily be filtered out.

It will be appreciated that, without deviating from the invention, the states used in the first phases I when the digital input signal assumes the middle value can be made part of a high frequency digital oscillation signal in other ways. For example a slightly lower frequency digital oscillation signal may be used that toggle in only part of the clock cycles when the digital input signal does not assume the high or low value, or a high frequency pseudo-random oscillation may be used to successively select the states for successive second phases and first phases in which the middle value is output.

It will be appreciated that the invention is not limited to the described circuits. For example, instead of current subtraction using summing nodes 120*a,b* voltage subtraction may be used. In that case, feedback signal generator will be modified to generate one of three voltages under control of the output signal from quantizer 16, a middle one of the voltage being supplied also as a return to zero voltage between supplying the voltages that are controlled by the output signal of the quantizer. In another example mixed voltage current addition circuits may be used.

Any form of generating three current levels from feedback signal generator may be used, using for example an conventional voltage to current converter with current source outputs to output currents to the summing nodes. However, the use of a single voltage source 182 connected to the summing nodes 120*a,b* via a switching network and resistors 188*a,b*, simplifies the design and provides an accurately calibrated circuit when the resistors 188*a,b* are well matched. Thus, the circuit is more robust against parameter spread and does not need complex calibration.

Resistors 188*a,b* may be implemented using any type of resistive structure such as an area of polysilicon, or FET devices with a constant control voltage etc. Although a bandgap reference 182 has been shown any other type of voltage reference may be used. However, the bandgap reference is advantageous because it provides a voltage that is hardly subject to external influences.

Although the embodiment shown produces mutually opposite currents through the resistors 188*a,b*, of course a common mode current may be added to these currents, for example by adding similar current sources at the internal nodes 185*a,b*. However, such a common current would require accurately matching to avoid non-linearities in analog to digital conversion. Use of mutually opposite currents makes such matching less critical.

Furthermore, although the circuit of FIG. 1 is intended for a 3 level output signal, one may use more output levels, for example 5 levels, for one of which the feedback signal is realized using the return to zero switch. Preferably an odd number of levels is used, with the return to zero level in the middle and the other level symmetrically and equidistantly disposed on either side of the return to zero level. Thus, a minimum of components is needed that affect the linearity. For example, the additional levels might be realized by including an additional combination of resistors and switching circuits connected to summing nodes 120a,b in parallel with the combination of resistors 188a,b and switching circuit 184a,b, 186a,b. Linearity will then be determined by resistor matching.

Instead of a single return to zero transistor 187 a combination of transistors, or any other type of switch, may be used, for example two switching transistors, each between a respective one of the internal nodes 185a,b and a node that supplies a reference voltage equal to half the bandgap voltage. However, the embodiment shown in FIG. 1, with a switch between the internal nodes is less complex, is more robust to parameter spread during manufacturing and makes use of voltage created using the bandgap reference to provide the third current level.

Similarly, instead of determining the common mode voltage at the summing nodes 120a,b with the bandgap reference 182 that is also used to control the size of the currents, one might use (by itself or ion combination with the bandgap reference 182) a separate voltage source to determine the common mode voltage. For example, a common mode voltage from the inputs 100a,b might be used if the capacitors 104a,b were omitted. However, by using bandgap reference 182 the circuit is made independent of the input signal and therefore more robust against external influences.

In the circuit of FIG. 1 the sampling is performed under control of the clock signal by the quantizer 16 but of course sampling may be performed elsewhere in the circuit. However, by performing sampling in the quantizer a time continuous loop filter 14 may be used. This improves the filtering operation of the filter.

The invention claimed is:

1. An electronic circuit with a sigma delta analog to digital converter, comprising:
   an input for receiving an analog input signal;
   a output for outputting a digital output signal selected from a set of three or more available values;
   a feedback loop arranged to generate the digital output signal so that a time averaged difference between the analog input signal and an analog feedback signal representative of the digital output signal is minimized;
   a feedback signal generator for generating signal levels of the feedback signal, each under control of a respective one of the output signal values, the feedback signal generator having a return to zero switch circuit for inserting return to zero levels between the signal levels in the feedback signal, the return to zero switch circuit being suitable to provide the signal level for at least one of the available values,
   wherein the input has two or more differential input terminals, and the feedback loop has two or more current summing nodes connectable to the differential input terminals, and a digitizing circuit for determining the output signal values from a difference between net currents supplied to the current summing nodes,
   and wherein the feedback signal generator has two or more resistors each coupled between a respective one of the current summing node and a respective internal node, a switching circuit coupled to the internal nodes, for inverting currents through the resistors depending on the output signal values, the return to zero switch circuit coupling the summing nodes via the internal nodes.

2. An electronic circuit according to claim 1, the return to zero switch circuit conductively coupling the summing nodes when active.

3. An electronic circuit according to claim 1, the feedback signal generator having a reference voltage source, the switching circuit providing a commutable connection for connecting opposite sides of the reference voltage source to respective ones of the internal nodes at least when providing the signal level for available values other than said one of the available values, the connection being commuted under control of the output signal values.

4. An electronic circuit according to claim 1, comprising a mixer, a local oscillator coupled to the mixer, the analog to digital converter having its analog input coupled to an output of the mixer.

* * * * *